United States Patent
Spica et al.

(10) Patent No.: US 10,983,852 B2
(45) Date of Patent: Apr. 20, 2021

(54) POWER MANAGEMENT COMPONENT FOR MEMORY SUB-SYSTEM VOLTAGE REGULATION

(71) Applicant: Micron Technology, Inc., Boise, ID (US)

(72) Inventors: Michael R. Spica, Eagle, ID (US); Patrick T. Caraher, Niwot, CO (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 16/262,111

(22) Filed: Jan. 30, 2019

(65) Prior Publication Data
US 2020/0243119 A1    Jul. 30, 2020

(51) Int. Cl.
*G06F 11/00* (2006.01)
*G06F 11/07* (2006.01)
*G06F 11/30* (2006.01)

(52) U.S. Cl.
CPC ...... *G06F 11/0727* (2013.01); *G06F 11/0751* (2013.01); *G06F 11/3037* (2013.01); *G06F 11/3058* (2013.01)

(58) Field of Classification Search
CPC ............. G06F 11/0727; G06F 11/0751; G06F 11/3034; G06F 11/3037; G06F 11/3058; G11C 5/47; G01R 19/16576
See application file for complete search history.

(56) References Cited

U.S. PATENT DOCUMENTS

| | | | |
|---|---|---|---|
| 10,009,016 B1 | 6/2018 | Ho et al. | |
| 10,019,021 B1* | 7/2018 | Lee | G06F 1/305 |
| 2010/0091531 A1* | 4/2010 | Lum | H02M 7/04 363/84 |
| 2010/0148708 A1 | 6/2010 | Jorgenson et al. | |
| 2011/0010567 A1* | 1/2011 | Schmitz | G06F 1/3296 713/300 |
| 2013/0041607 A1 | 2/2013 | Zimmerman et al. | |
| 2014/0082385 A1 | 3/2014 | Reule et al. | |
| 2014/0203866 A1 | 7/2014 | Sinha et al. | |
| 2016/0260472 A1 | 9/2016 | Xu et al. | |
| 2017/0194036 A1 | 7/2017 | Best et al. | |
| 2018/0128878 A1 | 5/2018 | Menon et al. | |
| 2018/0231590 A1 | 8/2018 | Choi et al. | |
| 2019/0079575 A1* | 3/2019 | Hanson | G11C 5/148 |
| 2019/0341120 A1* | 11/2019 | Zehavi | G06F 11/0727 |

OTHER PUBLICATIONS

International Search Report and Written Opinion from related international application No. PCT/US2019/065858, dated Apr. 7, 2020, 12 pages.
Office Action from related Taiwan patent application No. 108147154, dated Oct. 30, 2020, 7 pages.

* cited by examiner

*Primary Examiner* — Joseph D Manoskey
(74) *Attorney, Agent, or Firm* — Brooks, Cameron & Huebsch, PLLC

(57) ABSTRACT

A memory sub-system comprises a power management component comprising a plurality of regulators configured to supply respective operating voltages for components of the memory sub-system. The power management component is configured to adjust a regulator voltage level provided to a particular component until an operation state change of the particular component is detected. The power management voltage level is further configured to determine a value of the regulator voltage level at which the operation state change of the particular component is detected.

20 Claims, 5 Drawing Sheets

POWER MANAGEMENT COMPONENT FOR MEMORY SUB-SYSTEM VOLTAGE REGULATION

TECHNICAL FIELD

Embodiments of the disclosure relate generally to memory sub-systems, and more specifically, relate to a power management component for memory sub-system voltage regulation.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
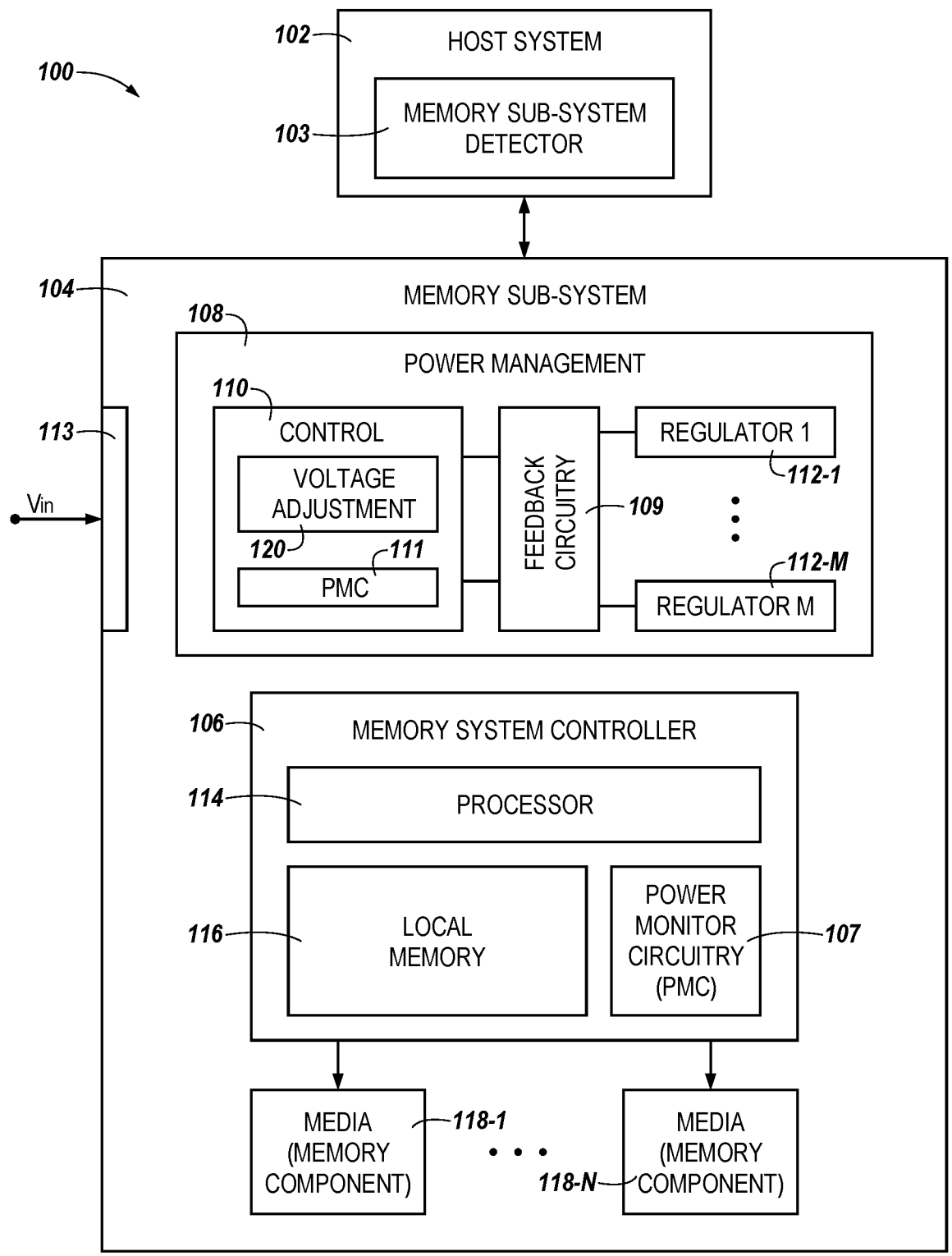
FIG. 1 illustrates an example computing environment that includes a memory sub-system in accordance with some embodiments of the present disclosure.

Aspects of the present disclosure are directed to a power management component for monitoring operating voltages of regulators. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Memory sub-systems (e.g., SSDs) can include a power management component such as a power management integrated circuit (PMIC). A power management component can include various regulators providing output voltages (e.g., regulator voltages) to power various system components, such as control circuitry, input/output (I/O) circuitry, array core circuitry, peripheral components, etc. The regulators can include buck regulators, boost regulators, buck-boost regulators, and/or low-dropout (LDO) regulators, among other regulator types. The regulator output voltages can correspond to various voltage rails for the memory sub-system, such as I/O rails, supply rails, reference rails, etc. As used herein, a voltage rail (or rail voltage) can be used to refer to an output voltage of a voltage regulator configured for a particular load. Some common voltage rails can include 1V, 2.5V, 3.3V, and 5V; however, embodiments of the present disclosure are not limited to particular rail voltage values.

In various instances, it can be beneficial to measure (e.g., test) the voltage levels actually being output by regulators of a power management component. Such measurements can be used, for example, in association with evaluating the power management component and/or various memory sub-system components powered thereby. For instance, it can be beneficial to determine a marginal operating range of components powered by PMIC regulators. Due to the dependence of the supplied rail voltages on multiple system components, it can be difficult to test the internally supplied rail voltages of a power management component without utilizing direct probing via circuitry external to the power management component, such as an in circuit test (ICT) system. Such ICT systems are utilized by various conventional systems.

Aspects of the present disclosure address deficiencies of previous approaches by stimulating and measuring regulator voltage levels using circuitry internal to a power management component (e.g., PMIC). Such internal measurements can be used to, for example, determine marginal operating voltage ranges for the regulators and/or components coupled thereto. In a number of examples, a PMIC regulator output voltage provided to a memory sub-system component can be adjusted until an operation state change of the component occurs. The operation state change can be for example, a change from a first state (e.g., an active state) to a brownout state. A brownout condition (e.g., brownout state) refers to a state in which a supply voltage provided to a powered component drops below a level at which the component can effectively operate. As described further herein, the regulator voltage levels can be adjusted and/or monitored via circuitry internal to the PMIC. For instance, feedback circuitry, an analog to digital converter (ADC), pulse width modulation circuitry, etc. can be used to adjust and monitor the regulator output voltage levels. The internally measured regulator output voltage level at which a component experiences a brownout condition can be used, for example, to determine a marginal operating range for the component and/or to determine whether the component is defective.

FIG. 1 illustrates an example computing environment 100 that includes a memory sub-system 104 in accordance with some embodiments of the present disclosure. The host system 102 can be a computing device such as a desktop computer, laptop computer, network server, mobile device, or such computing device that includes a memory and a processing device. The host system 102 can include or be coupled to the memory sub-system 104 so that the host system 102 can read data from or write data to the memory sub-system 104. The host system 102 can be coupled to the memory sub-system 104 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 102 and the memory sub-system 104. The host system 102 can further utilize an NVM Express (NVMe) interface to access the memory components 118-1 to 118-N when the memory sub-system 104 is coupled with the host system 102 by the PCIe interface. The physical host interface can provide an interface for passing control, address, data, and other signals between the memory sub-system 104 and the host system 102.

The host system 102 can include a memory sub-system detector 103. The host system 102 can be configured to, via the memory sub-system detector 103, determine an operation state of the memory sub-system 104 based on, for instance, an absence of signals to be received from the memory sub-system 104. In one example, the host system 102 can be configured to determine, via the memory sub-system detector 103, that the memory sub-system 104 has been physically decoupled from the host system 102. In another example, the host system 102 can be configured to determine, via the memory sub-system detector 103, that the memory sub-system 104 is, while the memory sub-system 104 is physically coupled to the host system 102, put into a different state (e.g., not operating) other than an active state. The memory sub-system 104 can be put into the different state when the memory sub-system 104 and/or at least a portion of components of the memory sub-system 104 experiences a brownout.

The memory sub-system 104 can include media, such as memory components 118-1 to 118-N. The memory components 118-1 to 118-N can be volatile memory components, non-volatile memory components, or a combination of such. In some embodiments, the memory sub-system 104 is a storage system. An example of a storage system is a SSD. In some embodiments, the memory sub-system 104 is a hybrid memory/storage sub-system. In general, the computing environment 100 can include a host system 102 that uses the memory sub-system 104. For example, the host system 102 can write data to the memory sub-system 104 and read data from the memory sub-system 104.

The memory components 118-1 to 118-N can include various combinations of the different types of non-volatile memory components and/or volatile memory components. An example of non-volatile memory components includes a negative-and (NAND) type flash memory. Each of the memory components 118-1 to 118-N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 118-1 to 118-N can be based on various memory technologies and/or array architectures. In some embodiments, the memory components 118-1 to 118-N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and which can be arranged as a planar array, a cross-point array, three-dimensional cross-point array, etc.

The memory system controller 106 can communicate with the memory components 118-1 to 118-N to perform operations such as reading data, writing data, or erasing data at the memory components 118-1 to 118-N and other such operations. The memory system controller 106 can include hardware such as one or more integrated circuits and/or discrete components, a buffer memory, or a combination thereof. The memory system controller 106 can be a microcontroller, special purpose logic circuitry (e.g., a field programmable gate array (FPGA), an application specific integrated circuit (ASIC), etc.), or other suitable processor. The memory system controller 106 can include a processing device (e.g., processor 114) configured to execute instructions stored in local memory 116. The local memory 116 of the memory system controller 106 includes an embedded memory configured to store instructions for performing various processes, operations, logic flows, and routines that control operation of the memory sub-system 104, including handling communications between the memory sub-system 104 and the host system 102. In some embodiments, the local memory 116 can include memory registers storing memory pointers, fetched data, etc. The local memory 116 can also include read-only memory (ROM) for storing micro-code.

The memory system controller 106 can further include power monitor circuitry 107. The memory system controller 106 can be configured to, via the power monitor circuitry 107, determine respective operation states of components of the memory sub-system 104 to which regulator voltages are provided. The power monitor circuitry 107 can be analogous to the power monitor circuitry 111 that is integrated within a control component 110. For example, the power monitor circuitry 107 can operate in lieu of the power monitor circuitry 111 of the control component 110 in the event that the power monitor circuitry 111 is not able to function properly While the example memory sub-system 104 in FIG. 1 has been illustrated as including the memory system controller 106, in another embodiment of the present disclosure, a memory sub-system 104 may not include a memory system controller 106, and can instead rely upon external control (e.g., provided by an external host, or by a processor or controller separate from the memory sub-system).

In general, the memory system controller 106 can receive commands or operations from the host system 102 and can convert the commands or operations into instructions or appropriate commands to achieve the desired access to the memory components 118-1 to 118-N. The memory system controller 106 can be responsible for other operations such as wear leveling operations, garbage collection operations, error detection and error-correcting code (ECC) operations, encryption operations, caching operations, and address translations between a logical block address and a physical block address that are associated with the memory components 118-1 to 118-N. The memory system controller 106 can further include host interface circuitry to communicate with the host system 102 via a physical host interface (not shown). The host interface circuitry can convert the commands received from the host system into command instructions to access the memory components 118-1 to 118-N as well as convert responses associated with the memory components 118-1 to 118-N into information for the host system 102.

The memory sub-system 104 can also include additional circuitry or components that are not illustrated. For instance, the memory components 118-1 to 118-N can include control circuitry, address circuitry (e.g., row and column decode circuitry), and/or input/output (I/O) circuitry by which they can communicate with memory system controller 106 and/or host system 102. As an example, in some embodiments, the address circuitry (can receive an address from the memory system controller 106 and decode the address to access the memory components 118-1 to 118-N.

The memory sub-system 104 includes a power management component 108. In some embodiments, the power management component 108 and/or functionality of the power management component 108 is part of the host system 102, an application, or an operating system. In various embodiments, the power management component be a power management integrated circuit (PMIC).

The power management component 108 can include a control component 110, feedback circuitry 109, and regulators 112-1 to 112-M. The regulators 112-1 to 112-M can operate to generate and output voltages (e.g., rail voltages) that can be provided to various components within the memory sub-system 104 as operating voltages. The regulators voltages of the regulators 112-1 to 112-M can be generated based on an input voltage (Vm). The input voltage can be supplied to the power management component 108 via a connector/interface 113 and can be further purposefully adjusted, prior to being supplied to respective regulators 112-1 to 112-M, to vary respective regulators voltages as further described herein.

The regulator voltages generated from the regulators 112-1 to 112-M can be provided to various components of the memory sub-system 104. As described herein, the regulator voltages can correspond to various voltage rails of the memory sub-system, such as I/O rails, supply rails, reference rails, etc. that are provided to power various system components, such as memory system controller 106 as well as components therein, memory components 118-1 to 118-M, control circuitry, input/output (I/O) circuitry, array core circuitry, peripheral components, etc. For example, the regulator voltages of the regulators 112-1 to 112-M can correspond to respective supply voltage rails used in the SSD.

The feedback circuitry 109 can be coupled to the regulators 112-1 to 112-M and to the control component 110. In some embodiments, the feedback circuitry 109 can be configured to receive regulator voltages of the regulators 112-1 to 112-M as respective inputs and provide feedback signals to the control component 110. The feedback circuitry 109 can include comparators and/or analog-to-digital converter (ADC), as further described in connection with FIG. 2A-2B. In response to receiving the feedback signals from the feedback circuitry 109, the control component 110 can determine values of respective regulator voltage levels of the regulators 112-1 to 112-M.

The control component 110 can include voltage adjustment component 120 and power monitor circuitry 111. By using the power monitor circuitry 111, the control component 110 can be configured to detect an operation state change of a respective component. The operation state change can correspond to when the respective component experiences a brownout. As an example, the power monitor circuitry 111 can monitor power status signals provided by various sub-system components powered by the PMIC 108. Such power status signals can be, for example, a power good/reset signal. By using the voltage adjustment component 120, the control component can be configured to adjust regulator voltages provided to respective components of the memory sub-system 104. In one example, the regulator voltages can be adjusted by adjusting the input voltage (Vm).

The control component 110 can utilize the power monitor circuitry 111, the voltage adjustment component 120, and the feedback signals received from the feedback circuitry 109 in a collaborative manner. In one example, the control component 110 can adjust a regulator voltage level provided to a particular component until an operation state change of the particular component is detected. In another example, the control component 110 can determine a value of the regulator voltage level at which the operation state change of the particular component is detected.

As described herein, a brownout of a particular component can also cause a brownout of other components of the memory sub-system 104. For example, a brownout of one of the memory components 118-1 to 118-N can further cause a brownout of the power management component 108 and/or the entire memory sub-system 104. Accordingly, a functionality of detecting an operation state and/or an operation state change of components of the memory sub-system 104 can be implemented across various components of the computing system 100. For example, the host system 102 can include the memory sub-system detector 103 that can detect an operation state of the memory sub-system 104, and the memory system controller 107 can include the power monitor circuitry 107, which can perform a similar functionality performable by the power monitor circuitry 111 that is internal to the power management component 108. The memory sub-system detector 103 and/or the power monitor circuitry 111 can communicate with the power management component 108 via various communication protocols, signals, and/or circuits such as inter-integrated circuit (I2C), general purpose input/output (GPIO) signals, and/or universal asynchronous receiver/transmitter (UART).

Figure 2A:
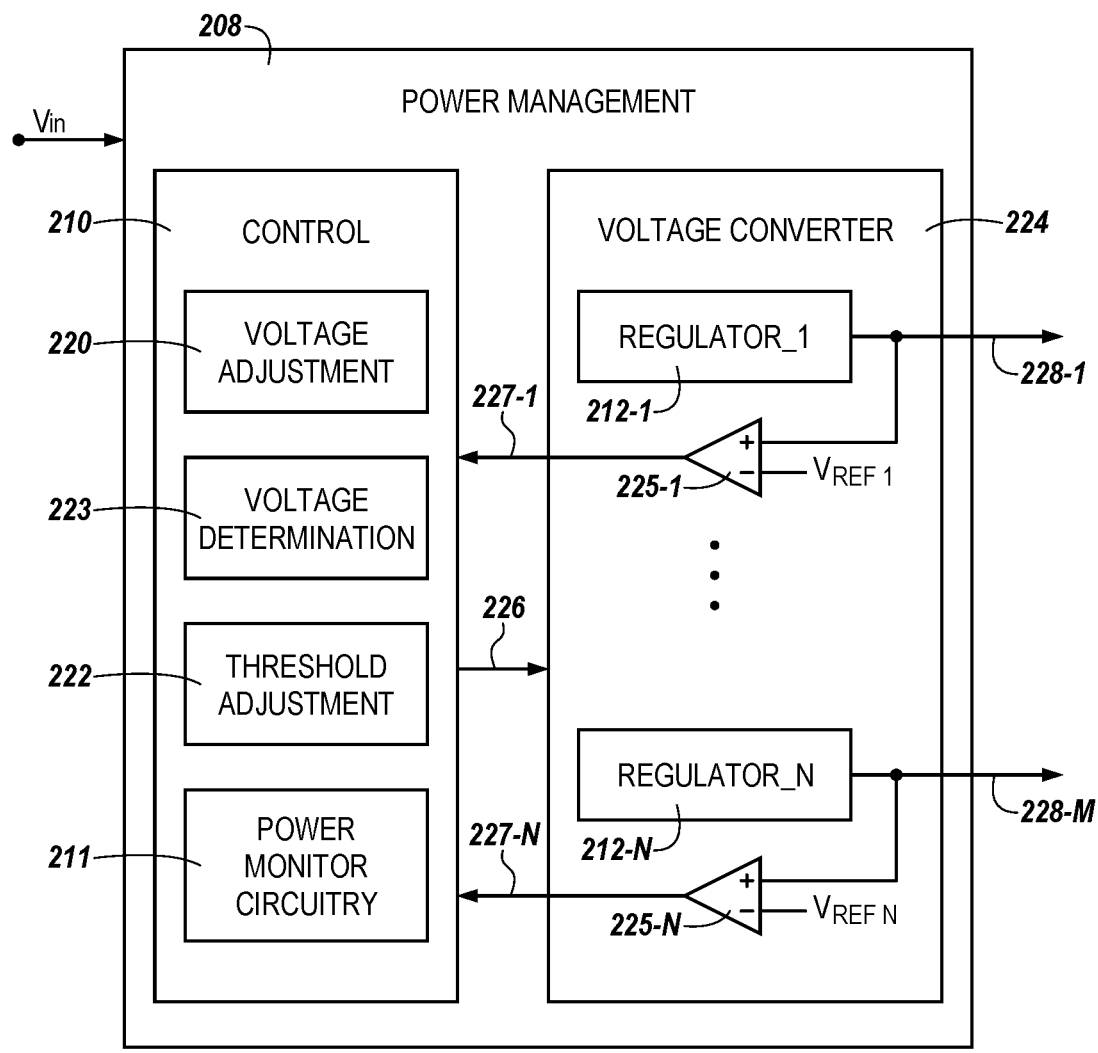
FIG. 2A-2B illustrate example power management components in accordance with some embodiments of the present disclosure.
Figure 2B:
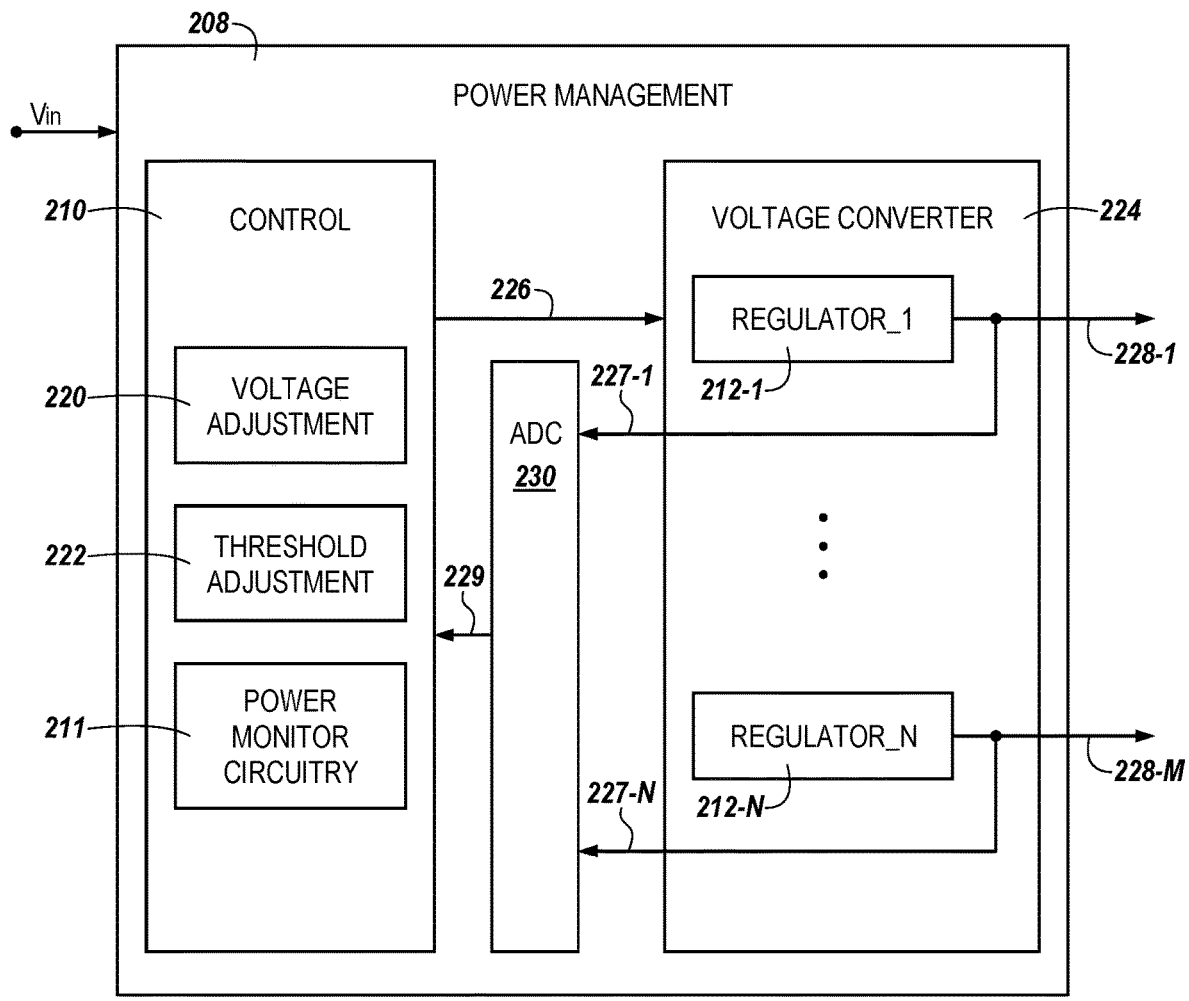

FIG. 2A-2B illustrate example power management components 208 in accordance with some embodiments of the present disclosure. The examples illustrated in FIG. 2A-2B include various types of feedback circuitry that is analogous to the feedback circuitry 109. The feedback circuitry can be used to measure regulator output voltage levels internal to a PMIC.

FIG. 2A illustrates an example of a power management component 208 including a number of comparators 225-1 to 225-M in accordance with some embodiments of the present disclosure. The power management component 208 can be a PMIC 211. The PMIC 211 can include a control component 210 and voltage converter 224. The voltage converter 224 can include regulators 212-1 to 212-M, and feedback circuitry illustrated, for example, as comparators 225-1 to 225-M. The regulators 212-1 to 212-M and the comparators 225-1 to 225-M can be collectively referred to as regulators 212 and comparators 225, respectively.

The PMIC 211 can be powered by an input voltage, which can be further adjusted by a voltage adjustment component 220 that is internal to the control component 210. The regulators 212 can be configured to generate respective regulator voltages 228-1 to 228-M (e.g., collectively referred to as regulator voltages 228) based on the adjusted input voltage. However, embodiments are not so limited. In one example, a regulator (e.g., buck-boost converter) can, without varying the input voltage, adjust a regulator voltage level by adjusting a pulse width modulation. In another example, a regulator voltage level of a particular regulator (e.g., low-dropout (LDO) regulator) can be adjusted by adjusting a position of a load line of the regulator voltage through a load modification.

The generated regulator voltages 228 can be provided, as operating voltages, to respective components of the memory sub-system such as the memory system controller 106, the processor 114, the local memory 116, and the memory components 118-1 to 118-N and/or various circuitry associated therewith (e.g., I/O circuitry, address circuitry, control circuitry, etc.). The regulators 212 can include a LDO regulator, a buck-boost converter, a buck regulator, a boost regulator, or combination thereof, although embodiments are not so limited.

As an example, an LDO regulator can be a linear voltage regulator that operates with a very small input-output differential voltage that can regulate an output voltage of the buck-boost converter to output one of the output voltages 228. Multiple LDO regulators can be provided based on the output voltages 228 that are used in the memory sub-system.

A buck-boost converter can detect the input voltage 220 and can operate in a buck-mode when the input voltage 220 is higher than an output voltage from the buck-boost converter. The buck-boost converter can operate in a boost-mode when the detected input voltage 220 is lower than an output voltage from the buck-boost converter. The buck-boost converter can contribute to output of a constant voltage.

A buck regulator can be a voltage reduction-type direct current (DC)/DC converter that can generate a predetermined output voltage by reducing the input voltage 220. The buck regulator can use a switching device that is turned on/off in a certain period and can have a structure in which an input power supply (e.g., the input voltage 220) is connected to a circuit while the switch is turned on and is not connected to the circuit while the switch is turned off. The buck regulator can output a DC voltage by averaging, through an inductor-capacitor (LC) filter, a voltage having a pulse shape that is periodically connected to or disconnected from a circuit in this manner. The buck regulator can use a principle of generating an output voltage by averaging a pulse voltage by periodically chopping a DC voltage such that the output voltage of the buck regulator can have a voltage that is less than an input voltage 220 of the buck regulator.

A boost regulator can be a voltage boost-type DC/DC converter. In the boost regulator, when a switch is turned on, the input voltage 220 can be connected to two terminals of an inductor to form a charge current. When the switch is turned off, the charge current can be transferred to a load. Accordingly, the amount of current of an output terminal of the boost regulator can be less than that of an input terminal of the boost regulator. Since there is no loss due to an operation principle of the boost regulator, an output voltage of the boost regulator can be higher than an input voltage 220 of the boost regulator, based on an "input current*input voltage=output current*output voltage" relationship.

Each comparator 225 can be configured to receive a regulator voltage (e.g., one of the regulator voltages 228) from a respective one of the regulators 212 and compare the received regulator voltage with a respective one of the reference voltages $V_{REF1}$ to $V_{REFN}$. For example, the comparator 225-1 can compare the regulator voltage 228-1 with the reference voltage $V_{REF1}$. The reference voltages are programmable values such that, for example, the reference voltages $V_{REF1}$ to $V_{REFN}$ can be programmed to different values by a threshold adjustment component 222 of the control component 210. As an example, the threshold voltage adjustment component 222 can adjust a reference voltage level in a number of particular increments/decrements. The programmable reference voltages $V_{REF1}$ to $V_{REFN}$ can be utilized to determine respective regulator voltage levels (values of the respective regulator voltages 228), as described further herein.

In some embodiments, at least two of the comparators 225 can have different respective reference voltages associated therewith. For example, a voltage level of the reference voltage $V_{REF1}$ can be different than a voltage level of the reference voltage $V_{REFN}$. As such, at least some of the regulator voltages 228 can be compared to different threshold voltage levels.

A result of the comparison can be provided to the control component 210 in the form of a signal (e.g., signals 227-1 to 227-M). The signals 227-1 to 227-M that can be provided by the comparators 225 can be binary in nature and can indicate whether a respective monitored output voltage is greater than a threshold voltage level. For example, the signals can represent binary logic values (e.g., a logical "1" or "0") with one binary value indicating that a regulator voltage is greater than a reference voltage and the other binary value indicating that a regulator voltage is not greater than a reference voltage.

The control component 210 can include power monitor circuitry 211, a voltage adjustment component 220, a threshold adjustment component 222, and a voltage determination component 223. As described herein, the control component 210 can, via the power monitor circuitry 211, determine an operation state and/or a change in an operation state of components of the memory sub-system (e.g., memory sub-system 104). In one example, the control component 210 can monitor power status signals of the components of the memory sub-system via the power monitor circuitry 211. The power status signals can indicate whether a respective component is in an active state (e.g., operating) or in an inactive state (e.g., brownout). By monitoring the power status signals, the power monitor circuitry 211 can determine when an operation state of a respective component has changed. The actual output voltage level of the regulator when such an operation state change occurs can be measured in various manners including, but not limited to, using comparators 225 as described in FIG. 2A and/or an ADC as described in FIG. 2B.

The control component 210 can, via the threshold adjustment component 222, adjust threshold values (e.g., reference voltage levels) of the comparators 225 to different (e.g., programmable) values (e.g., via signal 226). The control component 210 can, via the voltage determination component 223, determine regulator voltage levels based on the feedback signals 227-1 to 227-N received from the comparators 225.

The control component 210 can utilize various components of the control component 210 in a collaborative manner to determine a value of an operating voltage level at which an operation state change of a corresponding component is detected. For example, the voltage determination component 223 can collect information from the power monitor circuitry 211 and the feedback circuitry 109 as a regulator voltage level provided to the corresponding component and a respective threshold voltage level are adjusted by the voltage adjustment component 220 and the threshold adjustment component 222, respectively. Based on the collected information, the voltage determination component 223 can determine the regulator voltage level and further determine an operating voltage level based on the regulator voltage level, as further described below.

Table 1 illustrates an example of determining an operating voltage level by adjusting a regulator voltage and adjusting (e.g., rastering) a respective comparator threshold voltage level. As an example, a predetermined threshold voltage level (e.g., 2.5 V) of a comparator such as comparator 225-1, can be compared to a respective regulator output voltage each time the respective regulator voltage is adjusted, as shown in Table 1 below:

TABLE 1

| Iteration | $V_{OUT}$ | $V_{TH} = 2.5$ | $V_{TH} = 2.3$ |
|---|---|---|---|
| 1 | 3.3 | + | + |
| 2 | 3 | + | + |
| 3 | 2.7 | + | + |
| 4 | 2.4 | − | + |
| 5 | 2.1 | − | − |

Note that "$V_{OUT}$" indicates a regulator output voltage, "$V_{TH}$" indicates a respective threshold voltage of the comparator, "+" indicates that the regulator voltage is greater than the respective threshold voltage, and "−" indicates that the regulator voltage is less than the respective threshold voltage. In this example, during a first round of iterations, a regulator voltage is being iteratively adjusted and compared to a threshold voltage of 2.5 V (see column "$V_{TH}$=2.5" in Table 1). As shown in the example of Table 1, for the first, second, and third iterations $V_{OUT}$ is determined to be greater than the $V_{TH}$ (as indicated by "+"). During the fourth and fifth iterations at $V_{TH}$=2.5V, $V_{OUT}$ is determined to be less than the $V_{TH}$ (as indicated by "−"). Accordingly, it is determined that an operation state change of a component to which $V_{OUT}$ is provided has occurred at a regulator output voltage level of less than 2.5 V.

In this example, the $V_{TH}$ is adjusted from 2.5 V to 2.3 V for a second round of iterations. During the second round of iterations (e.g., column "$V_{TH}$=2.3" of Table 1), the $V_{OUT}$ is adjusted in a similar manner as the first round and is compared to the $V_{TH}$ of 2.3 V. As shown in Table 1, for the first, second, third, and fourth iterations, $V_{OUT}$ is determined to be greater than the $V_{TH}$ (as indicated by "+"). However, when $V_{OUT}$ is adjusted to 2.1 V for the fifth iteration, $V_{OUT}$, as determined by a feedback signal, is less than the VIE. Since different feedback signals are obtained during the fourth iteration over two rounds of iterations, an operating voltage level at which the operation state change has occurred can be determined based on $V_{TH}$ used during the fourth iteration of the first round and the second round. In one example, the operating voltage level that has put the corresponding component into a brownout state can be determined in terms of a range such as from 2.3 V to 2.5 V. In this example, therefore, a range of voltage levels within which a corresponding component can operate without an occurrence of an operation state change (e.g., without being put into a brownout state) can be determined to be from 2.5 V to 3.3 V, which is determined based on an upper bound (e.g., 2.5 V) of the range (e.g., 2.3 V to 2.5 V) previously determined. As used herein, a range of operating voltage levels within which a corresponding component can operate without an occurrence of an operation state change (e.g., being put into a brownout state) can be referred to as an operating voltage range. In another example, the operating voltage level can be determined in terms of particular numeric value (e.g., rather than a range) by interpolating between threshold voltage levels previously used for the comparisons such as 2.5 V and 2.3 V. For example, the interpolation performed between 2.5 V and 2.3 V can determine that an operating voltage level is 2.4 V. In this example, therefore, an operation voltage range of the monitored component can be determined to be from 2.4 V to 3.3 V, which is determined based on the operating voltage level being 2.4 V. Upon determining the operating voltage range, the power management component 208 can report the operating voltage range and/or the operating voltage level to the memory system controller 106 and/or the host system 102 (e.g., in association with a power system test).

In some embodiments, a more precise marginal operating voltage level can be determined by performing additional comparator VT adjustments, as shown by Table 2 below:

TABLE 2

| Iteration | $V_{OUT}$ | $V_{TH} = 2.5$ | $V_{TH} = 2.3$ | $V_{TH} = 2.45$ | $V_{TH} = 2.35$ |
|---|---|---|---|---|---|
| 1 | 3.3 | + | + | + | + |
| 2 | 3 | + | + | + | + |
| 3 | 2.7 | + | + | + | + |
| 4 | 2.4 | − | + | − | + |
| 5 | 2.1 | − | − | − | − |

For instance, continuing with the example above, a third round of iterations can be performed for an adjusted (e.g., incremented) VIE. In this example, the VIE is incremented by a particular amount (e.g., 0.15V), which is less than the amount by which the VIE was decremented in the second round (e.g., 0.2 V). Similarly, in a fourth around of iterations, the VIE can be adjusted (e.g., decremented) by a particular amount that is less than 0.15 V. In this example, the operating voltage level can be determined to be from 2.45 V to 3.3 V, which is determined based on an upper bound (e.g., 2.45 V) of the range (e.g., 2.35 V to 2.45 V) previously determined.

FIG. 2B illustrates an example of a power management component 208 including an analog-to-digital converter (ADC) 229 in accordance with some embodiments of the present disclosure. The ADC 229 can be coupled to the regulators 228 of the voltage converter 224 and to the control component 210. The ADC 229 can be configured to receive regulator voltages from respective regulators 228 as input analog signals and convert the regulator voltages to respective digital signals, for instance, by monitoring (e.g., sampling) the output voltages at a particular rate. The digital signals obtained from sampling the regulator voltage of the regulators 228 can indicate regulator output voltage levels of the regulators 228, as shown by Table 3 below:

TABLE 3

| Iteration | $V_{OUT}$ | Sampled Digital Values |
|---|---|---|
| 1 | 3.3 | 3.3 |
| 2 | 3 | 3 |
| 3 | 2.7 | 2.7 |
| 4 | 2.4 | 2.4 |
| 5 | 2.1 | 2.1 |

As such, the control component 210 can report the sampled values directly to the memory system controller 106 and/or the host system 102 without determining an operating voltage range and/or determining an operating voltage level by interpolating between threshold voltage levels previously used for comparisons. Accordingly, the power management component 208 including the ADC 229 as feedback circuitry may not include the voltage determination component 223.

Figure 3:
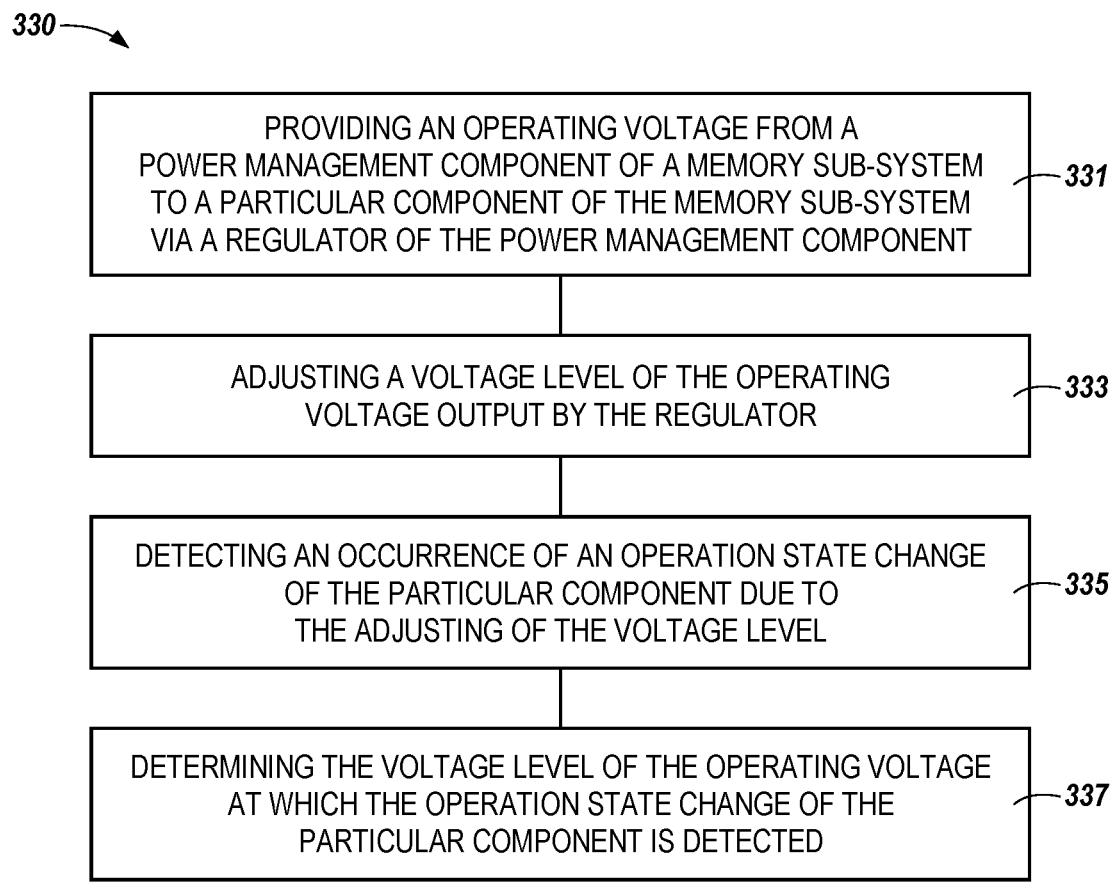
FIG. 3 is a flow diagram of an example method corresponding to determining operating voltage levels of regulators in accordance with some embodiments of the present disclosure.

FIG. 3 is a flow diagram of an example method for determining operating voltage levels in accordance with some embodiments of the present disclosure. The method 330 can be performed by processing logic that can include hardware (e.g., processing device, circuitry, dedicated logic, programmable logic, microcode, integrated circuit, etc.) software (e.g., instructions executed by a processing device), or a combination of thereof. In some embodiments, the method 330 can be performed by a power management component such as the power management component 108 of FIG. 1 or 208 of FIG. 2A or FIG. 2B. Although shown in a particular sequence or order, unless otherwise specified, the order of the processes of the method 330 can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 331, an operating voltage is provided from a power management component to a particular component of a memory sub-system via a regulator of the power management component. At block 333, a voltage level of the operating voltage output by the regulator is adjusted. The voltage level can be adjusted in an incremental or decremental manner. In one example, the voltage level of the operating voltage can be decreased (e.g., decremented) from a first voltage level until a first operation state change is detected. In another example, the voltage level of the operating voltage can be increased (e.g., incremented) above the first voltage level until a second operation state change is detected. The first operation state change can differ from the second operation state change in that, for example, the first operation state change can include a change from an active state to a brownout state, while the second operation state change can include a change from the brownout state to the active state.

The detection of the operation state change can occur in various manners. For instance, a system controller (e.g., system controller 106) may monitor a power status pin of a component receiving a regulator output voltage (e.g., a power rail). Responsive to the power status pin indicating a particular state of the component (e.g., a power bad status due to a brownout condition), the system controller may provide a signal to the PMIC (e.g., 108, 208) to indicate the operation state change. The PMIC can measure the regulator voltage at which the operation state change occurred as discussed above, and the measured regulator voltage can be reported to a host (e.g., 102) directly or via memory system controller (e.g., 106).

At block 335, the occurrence of an operation state change of the particular component due to the adjusting of the voltage level is detected. The operation state change can include, for example, a change from a particular state to a brownout state. The voltage level can be adjusted by the voltage adjustment component 220, as described in connection with FIG. 1 and FIG. 2.

At block 337, the voltage level of the operating voltage at which the operation state change of the particular component is detected can be determined. The voltage level can be determined via circuitry internal to the power management component such as the voltage determination component 223, as described in connection with FIG. 1 and FIG. 2. As described above, in a number of embodiments, the value of the regulator output voltage level at which the state change of the particular component occurs can be determined by rastering a threshold voltage of a comparator (e.g., of feedback circuitry internal to the PMIC) and/or by using a ADC internal to the PMIC.

In some embodiments, an operating voltage range can be determined based on the voltage levels previously determined. For example, an operating voltage range can be defined from a voltage level of the operating voltage initially output by the regulator to a voltage level of the operating voltage at which the operation state change is detected.

Embodiments of the present disclosure can provide benefits such as detecting manufacturing defects and/or estimating durability of regulators. For example, to determine a defective regulator, regulators can be tested, at a manufacturing level (e.g., prior to the regulators being available to customers), to determine which one of the regulators provides operating voltages with relatively low levels, which indicates defects. In another example, by determining an operating voltage level at which a corresponding component is put into a brownout state, a time at which the operating voltage level, as it decreases along with an aging of a regulator, will eventually fall below a particular level can be estimated (e.g., how many years would it take prior to a brownout due to the aging of the regulator).

Figure 4:
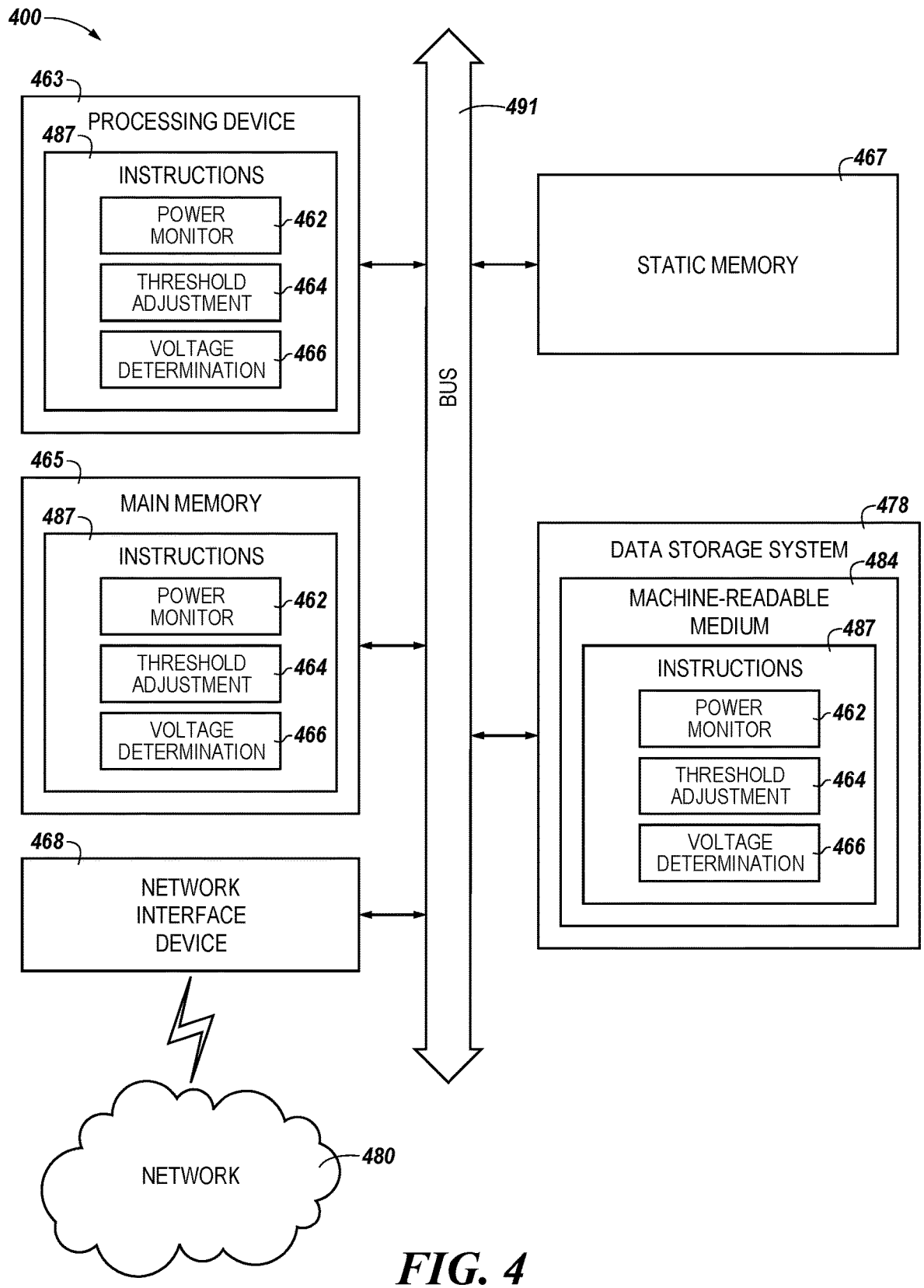
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 102 of FIG. 1) that includes, is coupled to, or utilizes a memory sub-system (e.g., the memory sub-system 104 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 463, a main memory 465, a static memory 448, and a data storage system 478, which communicate with each other via a bus 491. In some embodiments, the main memory 465 can be read-only memory (ROM), flash memory, dynamic random access memory (DRAM), such as synchronous DRAM (SDRAM) or Rambus DRAM (RDRAM), among other possibilities. In some embodiments, the static memory 467 can be flash memory, static random access memory (SRAM), among other possibilities. The data storage system 478 can correspond to the memory sub-system 104 of FIG. 1.

Processing device 463 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 463 can also be one or more special-purpose processing devices such as an application specific integrated circuit (ASIC), a field programmable gate array (FPGA), a digital signal processor (DSP), network processor, or the like. The processing device 463 is configured to execute instructions 487 for performing the operations and steps discussed herein. The computer system 400 can further include a network interface device 468 to communicate over the network 480.

The data storage system 478 can include a machine-readable storage medium 484 (also known as a computer-readable medium) on which is stored one or more sets of instructions 487 or software embodying any one or more of the methodologies or functions described herein. The instructions 487 can also reside, completely or at least partially, within the main memory 465 and/or within the processing device 463 during execution thereof by the computer system 400, the main memory 465 and the processing device 463 also constituting machine-readable storage media. The machine-readable storage medium 484, data storage system 478, and/or main memory 465 can correspond to the memory sub-system 104 of FIG. 1.

In one embodiment, the instructions 487 include instructions to implement functionality corresponding to power monitor 462, threshold adjustment 464, and voltage determination 466, which can correspond to power monitor circuitry 107 and/or 111, threshold adjustment component 222, and voltage determination component 105 and/or 223, respectively, of FIG. 1 and FIG. 2. While the machine-readable storage medium 484 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a", "an", or "a number of" can refer to one or more of something, and "a plurality of" can refer to one or more such things. For example, a memory device can refer to one or more memory devices, and a plurality of memory devices can refer to two or more memory devices. Additionally, the designator "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures can be identified by the use of similar digits. For example, 111 can reference element "11" in FIG. 1, and a similar element can be referenced as 211 in FIG. 2.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
a power management component comprising a plurality of regulators configured to supply respective operating voltages for components of the memory sub-system;
wherein the power management component is configured to:
adjust, until an operation state change of a particular component is detected, a regulator voltage level to a number of different voltage levels such that a first threshold voltage level is compared to the number of different voltage levels, wherein the regulator voltage level is provided to the particular component;

adjust, subsequent to the detection of the operation state change, the first threshold voltage level to a second threshold voltage level;

adjust, until the operation state change of the particular component is detected, the regulator voltage level to the number of different voltage levels such that the second threshold voltage level is compared to the number of different voltage levels of the regulator output voltage; and determine a value of the regulator voltage level at which the operation state change of the particular component is detected based on the first threshold voltage level and the second threshold voltage level.

2. The memory sub-system of claim 1, wherein the operation state change of the particular component comprises a change from a first state to a brownout state.

3. The memory sub-system of claim 1, wherein the power management component is configured to determine the value of the regulator voltage level at which the operation state change of the particular component is detected by using at least one of:

a comparator internal to the power management component, the comparator having a programmable threshold level; or an analog to digital converter internal to the power management component.

4. The memory sub-system of claim 3, wherein the power management component is further configured to determine the value of the regulator voltage level at which the operation state change of the particular component is detected by adjusting the programmable threshold level of the comparator in a number of particular increments.

5. The memory sub-system of claim 1, wherein the power management component is configured to detect the operation state change by monitoring a state of a power status signal of the particular component.

6. The memory sub-system of claim 1, wherein the power management component is configured to detect the operation state change by detecting a communication failure of the particular component.

7. The memory sub-system of claim 6, wherein the power management component is coupled to a controller configured to control a number of memory components, wherein the particular component is one of the number of memory components, and wherein the controller is configured to detect the communication failure of the particular component.

8. The memory sub-system of claim 1, wherein the power management component is further configured to determine an operating voltage range of the particular component based on the value of the regulator voltage level at which the operation state change of the particular component is detected.

9. The memory sub-system of claim 1, wherein the power management component is further configured to determine the value of the regulator voltage level at which the operation state change of the particular component is detected without directly probing the regulator voltage level provided to the particular component via a test circuit external to the memory sub-system.

10. The memory sub-system of claim 1, wherein the memory-subsystem comprises a solid state drive (SSD), and wherein the power management component comprises a power management integrated circuit (PMIC).

11. A method, comprising:

providing an operating voltage from a power management component of a memory sub-system to a particular component of the memory sub-system via a regulator of the power management component;

adjusting a voltage level of the operating voltage output by the regulator to a number of different voltage levels such that a first threshold voltage level is compared to the number of different voltage levels of the voltage level of the operating voltage;

adjusting, in response to detecting an occurrence of an operation state change of the particular component due to the adjusting of the voltage level, the first threshold voltage level to a second threshold voltage level;

adjusting, until the operation state change of the particular component is detected, the voltage level of the operating voltage to the number of different voltage levels such that the second threshold voltage level is compared to the number of different voltage levels of the voltage level of the operating voltage; and determining the voltage level of the operating voltage at which the operation state change of the particular component is detected based on the first threshold voltage and the second threshold voltage.

12. The method of claim 11, further comprising determining the voltage level of the operating voltage at which the operation state change of the particular component is detected via circuitry internal to the power management component.

13. The method of claim 11, further comprising adjusting the voltage level of the operating voltage output by the regulator via pulse width modulation.

14. The method of claim 11, wherein the operation state change comprises a change from a first state to a brown out state, and wherein the method includes adjusting the voltage level of the operating voltage output by the regulator until the particular component reaches the brown out state.

15. The method of claim 11, wherein adjusting the voltage level of the operating voltage output by the regulator comprises:

decreasing the voltage level of the operating voltage output by the regulator from a first voltage level until a first operation state change is detected; and increasing the voltage level of the operating voltage output by the regulator to a voltage level above the first voltage level until a second operation state change is detected.

16. The method of claim 11, further comprising determining an operating voltage range for the particular component based on a voltage level of the operating voltage initially output by the regulator and the voltage level of the operating voltage at which the operation state change of the particular component is detected.

17. A power management component, comprising:

a plurality of regulators configured to supply respective operating voltages for components of a memory sub-system;

feedback circuitry coupled to the plurality of regulators and to a control component, the feedback circuitry configured to:

compare a voltage level of a regulator output voltage provided to a particular component with a first threshold voltage level; and provide, to the control component, a feedback signal indicating a result of the comparison; and wherein the control component is configured to:

adjust, until an operation state change of the particular component is detected, the voltage level of the regulator output voltage to a number of different voltage levels such that the first threshold voltage level is compared to the number of different voltage levels of the regulator output voltage;

adjust, subsequent to the detection of the operation state change, the first threshold voltage level to a second threshold voltage level;

adjust, until the operation state change of the particular component is detected, the voltage level of the regulator output voltage to the number of different voltage levels such that the second threshold voltage level is compared to the number of different voltage levels of the regulator output voltage; and determine an operation voltage level at which the operation state change of the particular component is detected based on the first threshold voltage level and the second threshold voltage level.

18. The power management component of claim 17, wherein the control component is configured to determine the operation voltage level using an interpolation based on the first threshold voltage level and the second threshold voltage level.

19. The power management component of claim 17, wherein:

a first feedback signal indicating a result of the comparison between the first threshold voltage level and a particular one of the number of different voltage levels of the regulator output voltage comprises a signal having a first status; and a second feedback signal indicating a result of the comparison between the second threshold voltage level and the particular one of the number of different voltage levels of the regulator output voltage comprises a signal having a second status.

20. The power management component of claim 19, wherein:

the first status indicates that the first threshold voltage level is greater than the particular one of the number of different voltage levels of the regulator output voltage; and the second status indicates that the second threshold voltage level is less than the particular one of the number of different voltage levels of the regulator output voltage.

\* \* \* \* \*